(12) United States Patent
Slemmons et al.

(10) Patent No.: US 6,405,429 B1
(45) Date of Patent: Jun. 18, 2002

(54) MICROBEAM ASSEMBLY AND ASSOCIATED METHOD FOR INTEGRATED CIRCUIT INTERCONNECTION TO SUBSTRATES

(75) Inventors: John Whittier Slemmons, Port Townsend, WA (US); Jay Arthur Messner, Brea, CA (US); Frank John Woolston, Santa Ana, CA (US); Patrick Jordan Redmond, Tustin, CA (US); Pierino Italo Zappella, Garden Grove, CA (US); William Richard Fewer, Diamond Bar, CA (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/383,720

(22) Filed: Aug. 26, 1999

(51) Int. Cl.⁷ ............................................... H01R 93/00
(52) U.S. Cl. ............................. 29/827; 29/825; 29/829; 29/874
(58) Field of Search .......................... 29/827, 825, 829, 29/874, 882

(56) References Cited

U.S. PATENT DOCUMENTS

| | | | |
|---|---|---|---|
| 3,634,930 A | * | 1/1972 | Cranston ...................... 29/593 |
| 4,729,165 A | | 3/1988 | Fahrenschon |
| 4,766,670 A | * | 8/1988 | Gazdik et al. ................ 29/593 |
| 4,842,662 A | | 6/1989 | Jacobi |
| 4,979,664 A | | 12/1990 | Lyons et al. |
| 5,053,357 A | * | 10/1991 | Lin et al. ...................... 29/593 |
| 5,080,279 A | | 1/1992 | Davison |
| 5,098,008 A | | 3/1992 | Viza et al. |
| 5,241,134 A | | 8/1993 | Yoo |
| 5,414,298 A | * | 5/1995 | Grub et al. |
| 5,480,841 A | | 1/1996 | Bickford et al. |
| 5,631,447 A | | 5/1997 | Smith et al. |
| 5,647,124 A | | 7/1997 | Chan et al. |
| 5,806,181 A | * | 9/1998 | Khandros et al. |

OTHER PUBLICATIONS

Hewlett Packard Company, Application Note 992 entitled Beam Lead Attachment Methods.

* cited by examiner

Primary Examiner—Carl J. Arbes
(74) Attorney, Agent, or Firm—Dennis C. Bremer

(57) ABSTRACT

A microbeam interconnection method is provided to connect integrated circuit bond pads to substrate contacts. Conductive leads (microbeams) are releasably formed, by a process such as electroplating or vacuum deposition, over a release layer deposited on a ceramic, glass or similar carrier. The microbeam material adheres only very weakly to the release layer. After the inner ends of the microbeams have been bonded to IC bond pads, such as by flip chip bump bonding, and the integrated circuit has been fully tested, the IC is lifted away from the carrier, causing the microbeams to peel away from the release layer. After straightening the microbeams against a flat surface, the outer ends of the microbeams may then be bonded to contacts on an MCM or other substrate. The method permits full electrical testing at speed and high speed bonding. The method significantly reduces mechanical stresses in interconnect bonds and thereby improves integrated circuit reliability.

24 Claims, 4 Drawing Sheets

MICROBEAM ASSEMBLY AND ASSOCIATED METHOD FOR INTEGRATED CIRCUIT INTERCONNECTION TO SUBSTRATES

FIELD OF THE INVENTION

The present invention relates to interconnections between integrated circuits and substrates and, more particularly, to a microbeam assembly method which allows for electrical testing of an integrated circuit at speed and subsequent interconnection of the integrated circuit to a substrate.

BACKGROUND OF THE INVENTION

An essential step in the fabrication of microelectronic hardware is the step of providing electrical connections from the electronic devices to the interconnection board or substrate. As microelectronic devices such as integrated circuits become more highly integrated and more complex there is also great need for a method to fully functional test the device at speed before assembly into the circuit. Otherwise, large amounts of time are required to locate failed devices on a complex substrate containing several high lead count devices. For physically large devices the interconnection method must also be able to compensate for significant thermal expansion mismatches between the integrated circuit die and the interconnection substrate or board material. A number of unique approaches have been developed to solve some of these problems, such as TAB (tape automated bonding), beam lead bonding, and flipchip bonding.

As a point of reference, the most common approach to the interconnection of semiconductor devices involves mounting the device in a package and bonding fine wire (usually 1 mil gold or aluminum wire) from metallized pads on the device to the interior leads of the package using ultrasonic or thermocompression bonding methods. The package leads extend through the package wall and are subsequently connected to other circuitry, such as by a soldering process. In a variation on this approach, multiple copper leads (which are typically gold plated) are supplied on a polyimide tape so that the lead bonding and electrical testing processes can be highly automated. This automated lead bonding scheme is generally referred to by those skilled in the art as TAB.

FIG. 1 depicts a prior art TAB lead configuration for mounting and connecting an integrated circuit 30 to a substrate 32 using TAB leads 34, which are typically from 1 to 1.4 mils thick and may be made from copper or other suitable conductor. A plurality of TAB leads 34 may be provided on a flexible tape for high speed automated connection to integrated circuits and full automatic (at speed) testing 30. In FIG. 1, an integrated circuit 30 has been flipped so that integrated circuit (IC) bond pads 36 face down. The bond pads have been attached to the TAB lead 34 by thermocompression or thermosonic bonding, solder bump reflow or other bonding approaches as are know in the art. The other end of the TAB lead 34 is then attached to conductor 38 on substrate 32, such as an MCM package, via thermocompression or thermosonic bonding, solder bump reflow or other conventional lead bonding processes. Because commercially-available TAB leads are typically fairly thick in order to be rugged enough to withstand automated TAB lead bonding processes, the prior art structure of FIG. 1 may produce considerable stress in the projections 40, 42 and to the connection of the projections 40, 42 to the integrated circuit 30 or to the substrate 32 as the temperature of the structure changes. The stress is caused usually by the differential thermal expansion of the device, the substrate and/or the leads. Since the TAB lead 34 is thick and stiff, the stress is largely borne by the projections 40, 42 and the bond to the substrate conductors 38 and the IC bond pads 36. The bonds may fail under exposure to this repeated stress, and the reliability of the packaged integrated circuit nay thereby be degraded. Alternatively, in some applications the projection 42 is not required and the TAB lead 34 is instead bonded directly to the conductor 38.

Several techniques have been developed for making a mechanically-sound electrical contact between the chip bond pad and an electrical lead in lead bonding applications. In one technique, the contacts are formed by wire bonding. With wire bonding, thin wires are attached via thermocompression or thermosonic bonding to a lead and a respective bond pad on the chip.

Another standard technique forms the electrical contacts through solder bumps formed on the chip bond pads. The leads are first positioned over the solder bumps on the chip. A thermode is heated to a temperature which is above the melting point of the solder and brought into contact with the leads. Sufficient force is used to insure that the leads intimately contact the solder bumps during solder reflow.

TAB and other lead bonding approaches generally produce leads that extend beyond the chip footprint (such as by 40 mils), which may be a problem in applications requiring tight spacing. In addition, the high bonding forces required to bond a copper TAB lead may damage the chip or substrate and the removal of defective TAB bonded chips from a substrate is often difficult to accomplish without damaging the substrate. Moreover, TAB leads may require stress relief to alleviate thermal expansion mismatches with the chip and substrate.

Another popular interconnect technology is the so-called "flip chip" technology first developed by IBM. FIG. 2 depicts the flip chip approach. In flip chip, the integrated circuit 30 is flipped over so that the IC bond pads 36 face down. Connections are then made between the IC bond pads 36 and substrate conductors 38 on a substrate 32 via thermocompression or thermosonic bonding, solder reflow or other means for forming a flip chip bond between projection 44 and the substrate conductor as are known in the art. Since each integrated circuit typically includes a large number of IC bond pads 36, and since the integrated circuit (typically formed of silicon) is made of a material having a different thermal expansion coefficient than the substrate (alumina, for example), thermal expansion differences between the integrated circuit 30 and the substrate 32 may produce mechanical stresses in the flip chip projections 44. As the structure endures multiple thermal cycles during operation, the flip chip projections 44 may fracture or otherwise fail and integrated circuit functionality and reliability may be degraded as a result. Moreover, flip chip connections may be difficult to inspect for connection quality. In addition, flip chip solder bonding operations require solder flux, the removal of which can be difficult.

Yet another known interconnect technology is the beam lead process first developed by IBM. Beam lead technology is a semiconductor device fabrication and interconnection process whereby devices are fabricated on the semiconductor wafer with extra space (typically 8 to 12 mils) between devices. A set of interdigitated beam leads is then plated up to connect the active elements with gold conductors that can later be used to interconnect the devices to the next level circuitry. The individual devices are separated by etching the semiconductor from the back side of the wafer in the area above the plated beams so that the separated devices have individual beams extending beyond the device perimeter. The short, high conductive leads provided by the beam lead process are ideal for small high-speed diodes and transistors for microwave device applications, but the process is not useful for large lead count devices, does not permit functional testing at speed, and wastes significant wafer area to accommodate the beams.

Notwithstanding the variety of conventional lead bonding techniques available in the art, the electronics industry therefore still desires a more reliable lead bonding technology which does not require solder flux and which permits close spacing of the resulting integrated circuits. This desire for more reliable lead bonding technology seems to be becoming more important as the space available for lead bonding shrinks and as reliability requirements for resulting integrated circuits increase. Moreover, as devices become more complex and include more leads, automated testing at speed becomes more important to ensure that only knowngood devices are processed further.

SUMMARY OF THE INVENTION

According to one advantageous embodiment, the present invention provides a method of connecting an integrated circuit to a substrate comprising the steps of attaching the integrated circuit to conductive microbeams releasably formed on a carrier, lifting the integrated circuit from the carrier so as to separate the microbeams from the carrier, mounting the integrated circuit to a substrate, and connecting microbeams to respective substrate contacts. By utilizing microbeams according to the present invention, the integrated circuit can therefore be reliably connected to respective substrate contacts without requiring solder flux. In addition, the connection method of the present invention permits close spacing of the resulting integrated circuit by reducing the space required for lead bonding. Thus, the connection method of the present invention addresses each of the deficiencies of the prior art.

In an alternate advantageous embodiment of the present invention, a method is provided of forming integrated circuit bond pad leads comprising the steps of releasably forming conductive microbeams on a carrier, bonding integrated circuit bond pads to respective microbeams, and lifting the integrated circuit from the carrier so as to separate the microbeams from the carrier while the microbeams remain bonded to respective bond pads. The integrated circuit, complete with the microbeams bonded to respective bond pads, can then be mounted to a substrate or the like in order to appropriately connect the integrated circuit bond pad leads with respective substrate contacts via the microbeams.

According to another aspect of the present invention, a microbeam assembly is provided that is adapted to form interconnects between integrated circuit bond pads and substrate contacts. According to one advantageous embodiment of the invention, the microbeam assembly includes a carrier and a plurality of conductive microbeams releasably bonded to the carrier, wherein the conductive microbeams are sized and spaced to mate with the bond pads of an integrated circuit.

The method and apparatus of the present invention provide an integrated circuit packaging system that reduces interconnect bond mechanical stress and thereby improves reliability without requiring solder flux. As noted above, the integrated circuit packaging system of the present invention also permits close spacing among resulting integrated circuits by reducing the spacing required for lead bonding in comparison to conventional lead bonding techniques.

DETAILED DESCRIPTION OF THE INVENTION

The present invention will now be described more fully with reference to the accompanying drawings, in which preferred embodiments of the invention are shown. This invention may, however, be embodied in many different forms and should not be construed as limited to the embodiments set forth here; rather, these embodiments are provided so that this disclosure will be thorough and complete and will fully convey the scope of the invention to those skilled in the art. Like numbers refer to like elements throughout.

Figure 1:
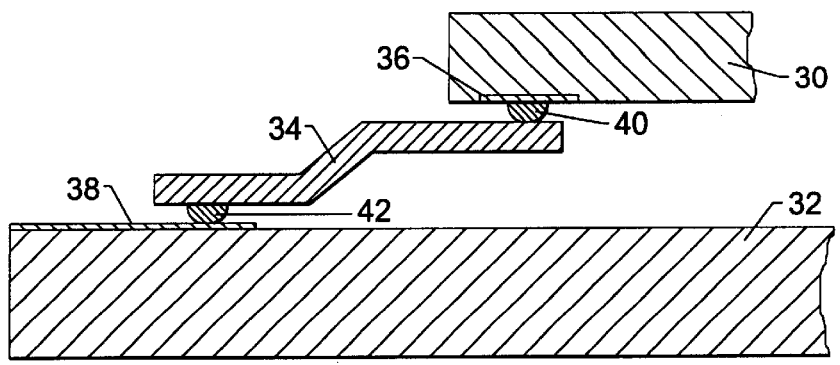
FIG. 1 is a side view of a prior art TAB lead configuration for mounting and connecting an integrated circuit to a substrate.
Figure 2:
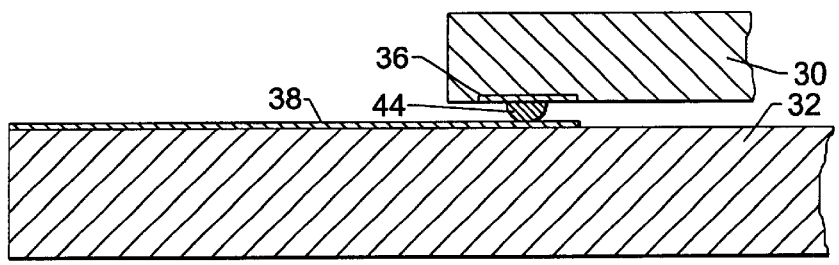
FIG. 2 is a side view of a prior art flip chip configuration for mounting and connecting an integrated circuit to a substrate.
Figure 3:
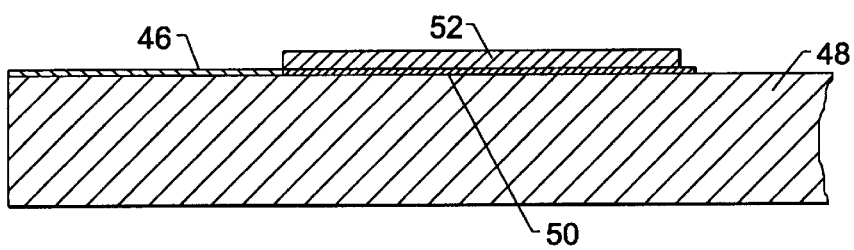
FIG. 3 is a side view of a carrier including fan-out conductor metallization, a release layer, and a microbeam.

One advantageous embodiment of the microbeam assembly according to the present invention is depicted in FIG. 3. In FIG. 3, fan-out conductors 46 have been patterned on portions of a carrier 48 and a release layer 50 has been deposited on the carrier 48 on areas adjacent the fan-out conductors 46. The release layer 50 may be a thin layer of tungsten or other suitable material which may be deposited on a carrier to allow a conductive microbeam 52 to be formed via electroplating, other plating processes, or other material build-up processes as are known in the art. The release layer 50 preferably has the property of permitting the subsequent formation of conductive microbeams while adhering only very weakly to the microbeams. Microbeams 52 formed thereon may thereby subsequently be lifted from the release layer 50 with very little lifting force.

While the release layer 50 may be formed of tungsten, the release layer 50 may also be formed of a very thin oxidized metal layer or of a thin layer of polyimide or parylene. In addition, other metallic or non-metallic materials, such as spin-on oxide or spin-on glass coatings, may be used to form the release layer 50 so long as the release layer will adhere to the microbeams 52 very weakly without contaminating the underside of the microbeams 52 (so as to thereby avoid bonding difficulties that may result from microbeam surface contamination).

The polyimide material used to form the release layer 50 may be a liquid organic polyimide such as Pyralin PI-2570 from Dupont. The polyimide may be applied to the carrier 48 by a spin-on process as is commonly used for photoresist coatings in the semiconductor industry. Alternatively, the polyimide may be applied by such drop dispensing, spraying, or roller coating processes as are known in the art.

Alternatively, the microbeams 52 may be formed on a lift-off polyimide material soluble in a release solvent. In this approach, the release layer 50 is dissolved after formation of the microbeams 52, thereby releasing the microbeams. Alternatively, the polyimide release layer may be removed from under the microbeams 52 by plasma etching of the polyimide with oxygen or with a reactive gas such as CF4 as is known in the art.

The carrier 48, according to one embodiment of the present invention, is a substantially rigid carrier, such as a glass or ceramic carrier, upon which the fan-out conductors 46, release layer 50, and microbeams 52 may be formed.

After the release layer 50 has been formed on the carrier 48, the microbeams 52 are formed on top of the release layer, such as by electroplating. The conductive microbeams 52 are preferably sized and spaced to mate with the bond pads of an integrated circuit. The microbeams may be formed of gold, copper,.alloys thereof, or other suitable conductive materials or alloys as is known in the art. For example, in one preferred embodiment the microbeams 52 comprise one-half ounce copper conductors. In one advantageous embodiment, the microbeams are between 0.4 mils and 0.7 mils thick, although the microbeams can have other thicknesses without departing from the spirit and scope of the present invention.

As will be discussed below, bumps, such as gold or solder bumps, and solder dams or other features can be formed on the microbeams or the devices in wafer form as needed. These features may be chosen for the particular bonding system employed for interconnection between the integrated circuit, the microbeams, and the substrate to which the integrated circuit will eventually be mounted and connected. These features may be formed by any feature formation processes as are known in the art. A variety of advantageous configurations of the IC bond pad, the microbeam, and the structure of the bond between the two are discussed below.

In order to fabricate a microbeam assembly according to one embodiment, a mask or other artwork is prepared so that fan-out conductors 46 can be formed on the carrier to deliver test signals to and from the microbeams 52 in a fanned out configuration to and from test points on the perimeter of the carrier. All of the fan-out conductors 46 are preferably shorted together at the outer edge of the carrier 48, beyond the test pads, so that the fan-out conductors 46 can be simultaneously electroplated as is known in the art. Subsequent carrier sawing operations will separate those portions of the fan-out conductors that are shorted together, thereby electrically isolating all of the fan-out conductors 46 for subsequent integrated circuit electrical testing.

Before or after formation of the fan-out conductors 46, a release layer 50 is deposited around the fan-out conductors on the remainder of the carrier. A second mask or other artwork is then prepared to allow selective electroplating of microbeams 52 on top of the release layer 50. The microbeams 52 are preferably 2 to 4 mils wide and preferably extend beyond the eventual device perimeter by 12 to 18 mils. The outer end of each microbeam preferably extends to the outer edge of the release layer. As such, each microbeam makes electrical contact with a respective fan-out conductor.

Figure 4:
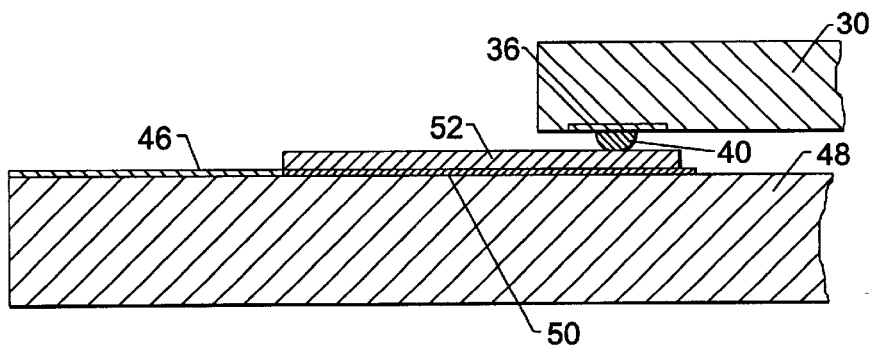
FIG. 4 is a side view depicting an integrated circuit contact bonded to a microbeam.

The next processing step is illustrated in FIG. 4. once fan-out conductors 46 and releasable microbeams 52 have been formed on the carrier 48, an integrated circuit 30 is flipped and bonded at the IC bond pads 36 to one end of the microbeams. The IC bond pads 36 may be bonded to the microbeam 52 with diffusion bonding, thermocompression or thermosonic bonding, solder reflow or such other IC bond pad bonding techniques as are known in the art. As will be discussed in detail below, a number of different configuration options are available for the configuration of the IC bond pad 36, the microbeam 52, and the structure of the projection 40. Electrical testing may then be performed on the integrated circuit through the electrical connection formed from the IC bond pad 36 through the projection 40 and the microbeam 52 to the fan-out conductor 46 and to a test pad at the outer edge of the carrier 48.

Figure 5:
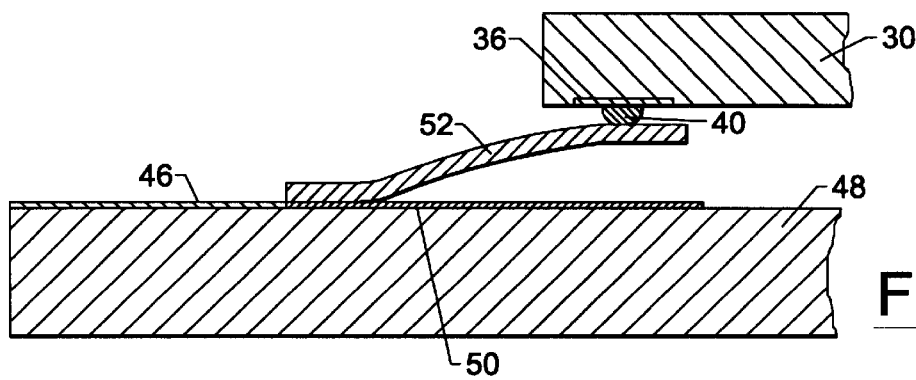
FIG. 5 is a side view depicting a microbeam releasing from a carrier as the integrated circuit is lifted away from the carrier.

The next step in the process is depicted by FIG. 5. After electrical testing of the integrated circuit is complete, the integrated circuit 30 is lifted away from the carrier 48 to cause the microbeams 52 to peel away from or otherwise release from the release layer 50 deposited on the carrier. It is important to precisely control the adhesion characteristics of the interface between the release layer 50 and the microbeam 52 so that the release of the microbeam may be accomplished without undo stress to the projection 40 at the IC bond pad 36 or deformation of the microbeam 52. Preferably, the microbeams must consistently release from the release layer 50 with very light lifting force, such as less than one gram.

Figure 6:
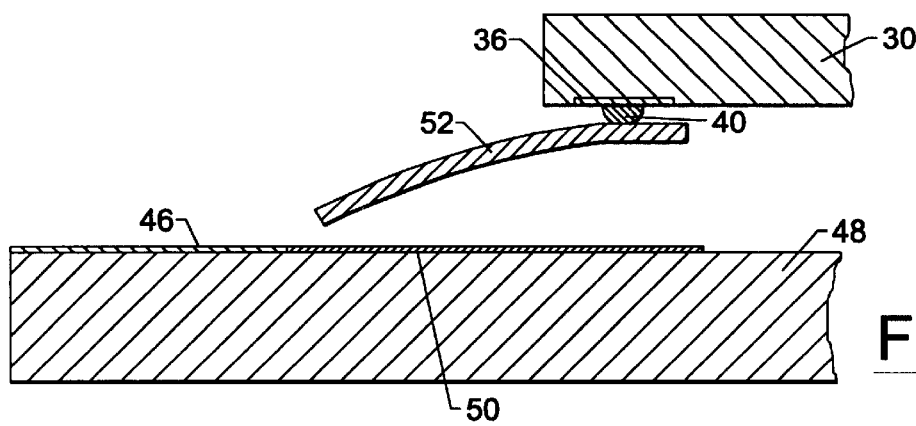
FIG. 6 is a side view depicting a microbeam fully released from a carrier after the integrated circuit has been lifted away from the carrier.

As the integrated circuit 30 continues to be separated from the carrier 48, the microbeam 52 is fully released from the release layer 50 and the attachment to the fan-out conductors 46 at the end of the microbeams is severed, as is shown in FIG. 6. The integrated circuit 30 is preferably then touched lightly on a flat surface to planarize all of the microbeams bonded to the integrated circuit and to prepare the integrated circuit/microbeam assembly for mounting to a substrate. This planarization is preferably accomplished by lightly touching the microbeams 52 against a smooth glass or other appropriate surface, although other microbeam planarization methods may be employed as will be apparent to those skilled in the art without departing from the present invention.

Figure 7:
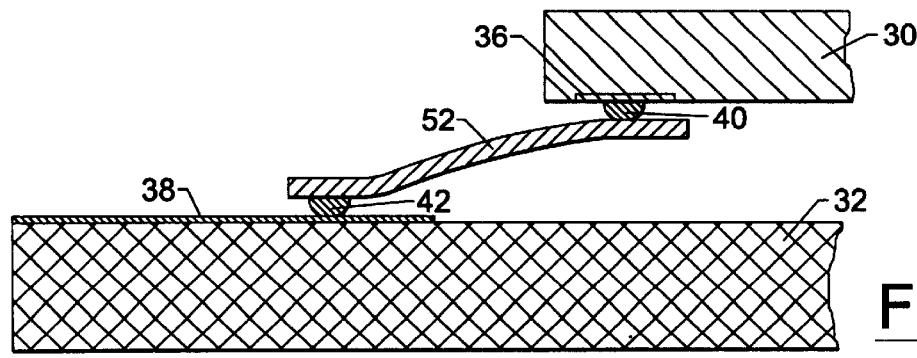
FIG. 7 is a side view illustrating the attachment of an integrated circuit with microbeams to an MCM or other substrate.

As illustrated in FIG. 7, the integrated circuit 30 with microbeams assembled is then mounted to a multichip module (MCM) or other packaging substrate 32 and connections are made between the substrate conductors 38 and the ends of the microbeams 52 opposite the IC bond pads 36. Typically, the substrate is formed of alumina or glass and the substrate contacts are formed of gold or other conductive materials. The projections 42 between the microbeams 52 and the substrate conductors 38 may be accomplished with thermocompression or thermosonic bonding, solder reflow or other appropriate bonding techniques as are know in the art. Because the microbeams 52 are thin and flexible, any thermal expansion mismatches between the integrated circuit and the substrate are absorbed by slight deflection or flexing of the microbeams. Stresses in the projections 40, 42, at the IC bond pads 36 and at the substrate conductors 38 are thereby greatly minimized. Reliability of the integrated circuit 30 is thereby maximized.

Figure 8A:
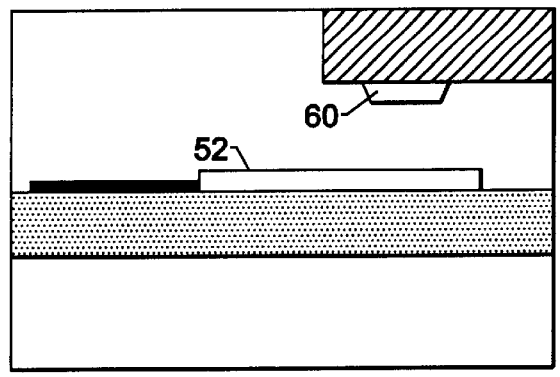
FIGS. 8A through 8D depict side views prior to the attachment of integrated circuit bond pads to microbeams according to several different embodiments of the present invention.
Figure 8B:
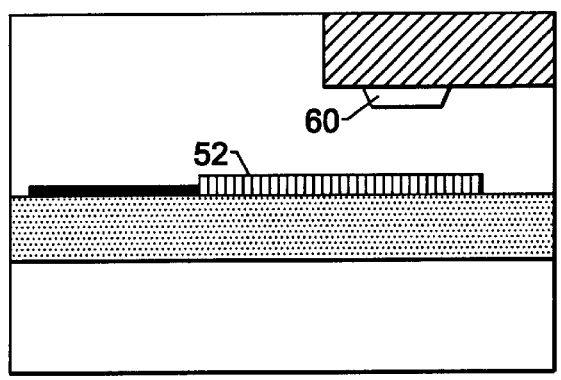
Figure 8C:
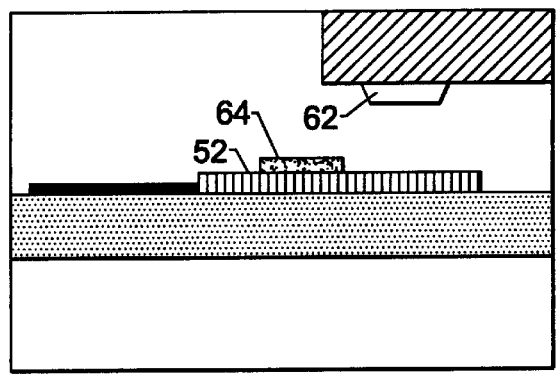
Figure 8D:
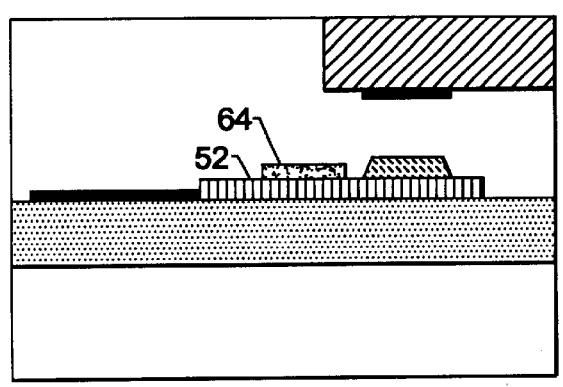

FIGS. 8A–8D depict a number of possible combinations of IC bond pads 36, microbeams 52 and projections 40 that may be accommodated with the method and apparatus of the present invention. Other combinations may be employed, however, without departing from the present invention. FIG. 8A depicts a configuration wherein a gold bump 60 has been formed on the IC bond pad and a microbeam 52 formed of either gold or gold plated copper has been deposited on the carrier. FIG. 8B depicts a configuration wherein a solder bump 62 has been formed on the IC bond pad while the microbeam 52 comprises solder coated copper and a solder dam 64. To permit solder reflow bonds at each end of the microbeams 52 at different processing stages, different solder systems are used at the opposite ends of the microbeams with associated different solder melt temperatures. FIG. 8C depicts a configuration including a solder coated copper microbeam 52 having two solder compositions for separate reflow at each end. The microbeam also includes a solder dam 64 and a solder bump at one end for being with the IC bond pads, which are typically formed of alumina or gold. FIG. 8D provides a configuration where the IC bond pads 36 are aluminum while the microbeam 52 is comprised of either gold with a tungsten barrier layer or copper. In addition, the microbeam has an aluminum bump 66 formed for bonding to the corresponding IC bond pad 36. Alternatively, the IC bond pads 36 can be gold and the microbeams 52 can be either gold or copper with gold bumps 68 formed thereon for connection to the IC bond pads. The foregoing advantageous embodiments of the present invention are examples only; as will be apparent to those skilled in the art following a review of the present disclosure, a number of metallization systems and bond structures may be utilized without departing from the present invention.

Figure 9:
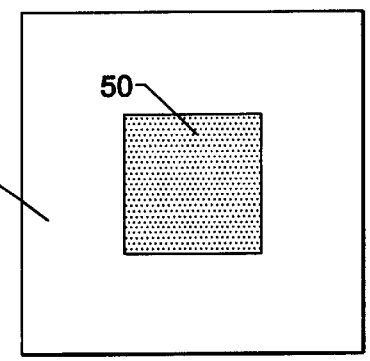
FIG. 9 is a plan view of a carrier depicting a microbeam release area and a fan-out area.

A plan view of a carrier according to the present invention is illustrated in FIG. 9. As shown, the release layer 50 may advantageously be deposited on an inner portion of the carrier 48 so that the microbeams 52 may be formed thereon and so that microbeam bonds with integrated circuit bond pads may thereby be formed. The fan-out conductors 46 would extend from the edge of the release area 50 to the periphery of the carrier 48, terminating in test pads 70 for electrical testing of integrated circuits after connection to the microbeams.

Figure 10:
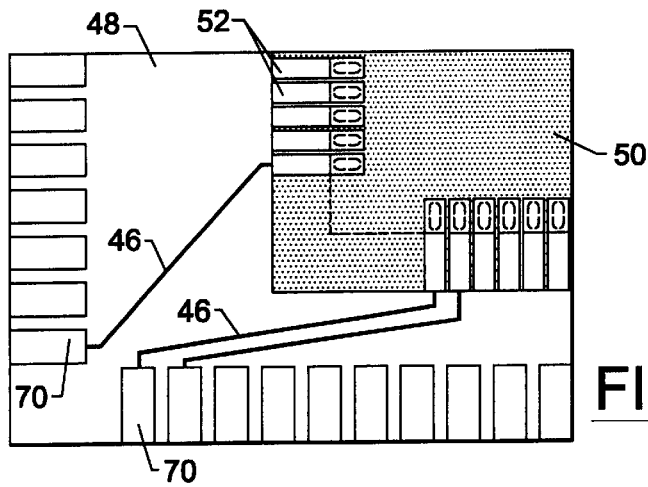
FIG. 10 is a plan view of a carrier depicting microbeams releasably formed on the carrier and fan-out conductors interconnecting the microbeams to test pads on the carrier.

FIG. 10 provides a plan view showing more detail of individual microbeams 52, fan-out conductors 46, and test pads 70. The dotted line in FIG. 10 represents the outline of an integrated circuit to be bonded to the microbeams, and individual bond regions are shown on the inside edge of each microbeam 52 for connection to IC bond pads. As will be apparent, the integrated circuit packaging system of the present invention reduces the spacing required for lead bonding in comparison to conventional lead bonding techniques, thereby permitting closer spacing of the resulting integrated circuits.

Figure 11:
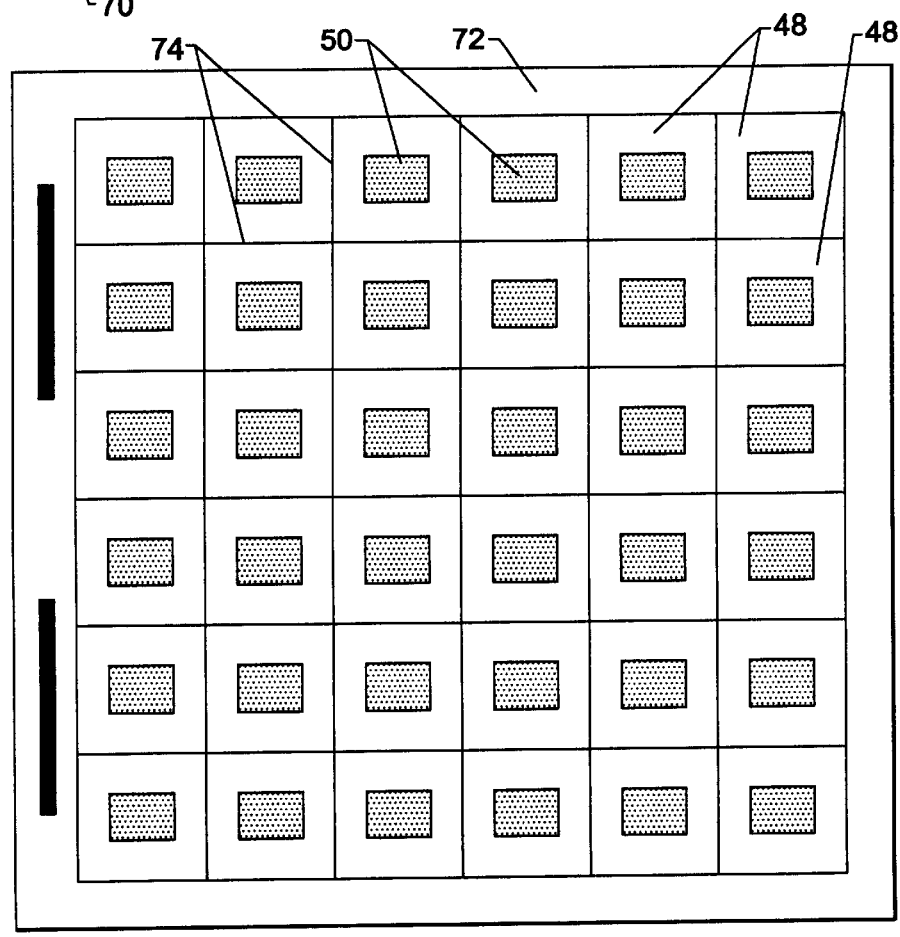
FIG. 11 is a plan view of a single carrier sheet defining a plurality of carriers including microbeam release areas.

FIG. 11 depicts a configuration for providing multiple carriers from a single carrier sheet 72 in a volume production mode. The carrier sheet 72 comprises a single thin sheet of glass, ceramic or other suitable material, and areas for release layers 50 are deposited as indicated by the shaded areas. Saw lines 74 crisscrossing the carrier sheet 72 define each carrier 48. With this configuration, fan-out conductors 46 for each carrier may be shorted together electrically over the entire carrier sheet so that fan-out conductor electroplating, release layer deposition, and microbeam build-up may be accomplished for an entire carrier sheet in a batch process. The fan-out conductors are preferably all shorted together along the saw lines 74 so that all of the fan-out conductors will be electrically separate and will be ready for device bonding and electrical testing when individual carriers 48 are formed by sawing the carrier sheet 72. Electrical contacts for plating operations should preferably be provided on the perimeter of the carrier sheet in order to ensure uniform plating. As will be understood by those skilled in the art, a number of other configurations for the batch processing of multiple carriers for microbeams may be utilized without departing from the present invention.

In any event, the method and apparatus of the present invention provides an integrated circuit assembly system that allows for full electrical testing at speed and high throughput bonding that reduces interconnect bond mechanical stress and thereby improves reliability without requiring solder flux. The integrated circuit packaging system of the present invention also permits close spacing among resulting integrated circuits by reducing the spacing required for lead bonding in comparison to conventional lead bonding techniques.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A method of connecting an integrated circuit to a substrate, the method comprising the steps of:

attaching the integrated circuit to a plurality of conductive microbeams releasably supported by a carrier;

lifting the integrated circuit from the carrier so as to separate the microbeams from the carrier;

mounting the integrated circuit to a substrate following separation of the microbeams from the carrier; and connecting the plurality of microbeams to respective ones of a plurality of substrate contacts.

2. A method of connecting an integrated circuit to a substrate according to claim 1 wherein the attaching step comprises diffusion bonding the integrated circuit to the conductive microbeams.

3. A method of connecting an integrated circuit to a substrate according to claim 2 further comprising a step of providing an integrated circuit comprising bumps for electrical connection with the conductive microbeams.

4. A method of connecting an integrated circuit to a substrate according to claim 1 wherein the attaching step comprises reflowing solder to attach the integrated circuit to the conductive microbeams.

5. A method of connecting an integrated circuit to a substrate according to claim 4 further comprising providing an integrated circuit comprising bumps for electrical connection with the conductive microbeams.

6. A method of connecting an integrated circuit to a substrate according to claim 1 wherein the attaching step comprises tape automated bonding the integrated circuit to the conductive microbeams and wherein the carrier is a TAB carrier adapted for automated conductive microbeam attachment.

7. A method of connecting an integrated circuit to a substrate according to claim 1 further comprising providing a carrier that is substantially rigid.

8. A method of connecting an integrated circuit to a substrate according to claim 1 further comprising providing a carrier comprising fan-out conductors for electrical testing of the integrated circuit.

9. A method of connecting an integrated circuit to a substrate according to claim 1 further comprising providing a carrier comprising a release layer for releasably supporting the conductive microbeams.

10. A method of connecting an integrated circuit to a substrate according to claim 9 wherein said providing step comprises providing a carrier having a release layer comprised of tungsten.

11. A method of connecting an integrated circuit to a substrate according to claim 1 further comprising providing at least one microbeam comprising a bump.

12. A method of connecting an integrated circuit to a substrate according to claim 11 wherein said providing step comprises providing a microbeam having a bump comprised of solder.

13. A method of connecting an integrated circuit to a substrate according to claim 12 wherein said providing step comprises providing a microbeam having a solder dam.

14. A method of connecting an integrated circuit to a substrate according to claim 1 further comprising providing a substrate comprising a multichip module.

15. A method of connecting an integrated circuit to a substrate according to claim 1 wherein the connecting step comprises compression bonding the microbeams to respective substrate contacts.

16. A method of connecting an integrated circuit to a substrate according to claim 1 wherein the connecting step comprises reflowing solder to connect the microbeams to respective substrate contacts.

17. A method of connecting an integrated circuit to a substrate according to claim 1 further comprising the steps of:
   fabricating a plurality of carriers from a single carrier sheet;
   forming a plurality of conductive microbeams on each of a plurality of carriers; and
   dividing the carrier sheet to thereby form individual carriers prior to said attaching step.

18. A method of forming leads for an integrated circuit having a plurality of bond pads, the method comprising the steps of:
   releasably forming a plurality of conductive microbeams on a carrier;
   bonding the plurality of bond pads to respective ones of the plurality of microbeams releasably formed on the carrier; and
   lifting the integrated circuit from the carrier so as to separate the microbeams from the carrier, wherein the microbeams remain bonded to respective ones of the bond pads.

19. A method of forming leads for an integrated circuit having a plurality of bond pads according to claim 18 wherein the bonding step comprises diffusion bonding the bond pads to respective microbeams.

20. A method of forming leads for an integrated circuit having a plurality of bond pads according to claim 18 wherein the bonding step comprises reflowing solder to bond the bond pads to respective microbeams.

21. A method of forming leads for an integrated circuit having a plurality of bond pads according to claim 18 wherein the attaching step comprises tape automated bonding the bond pads to respective microbeams and wherein the carrier is a TAB carrier adapted for automated conductive microbeam attachment.

22. A method of forming leads for an integrated circuit having a plurality of bond pads according to claim 18 further comprising providing a carrier that is substantially rigid.

23. A method of forming leads for an integrated circuit having a plurality of bond pads according to claim 18 further comprising the steps of:
   fabricating a plurality of carriers from a single carrier sheet; and
   dividing the carrier sheet to thereby form individual carriers.

24. A method of forming leads for an integrated circuit having a plurality of bond pads according to claim 18 further comprising providing a carrier comprising a release layer for releasably supporting the conductive microbeams.

* * * * *